United States Patent [19]
Abboud et al.

[11] Patent Number: 5,393,987
[45] Date of Patent: Feb. 28, 1995

[54] DOSE MODULATION AND PIXEL DEFLECTION FOR RASTER SCAN LITHOGRAPHY

[75] Inventors: Frank E. Abboud, Hayward; Andrew J. Muray, Fremont, both of Calif.; C. Neil Berglund, Oregon City, Oreg.

[73] Assignee: ETEC Systems, Inc., Hayward, Calif.

[21] Appl. No.: 69,222

[22] Filed: May 28, 1993

[51] Int. Cl.$^6$ .......................................... H01J 37/302
[52] U.S. Cl. ................................................ 250/492.22
[58] Field of Search ................. 250/492.2, 492.22, 398

[56] References Cited

U.S. PATENT DOCUMENTS

| | | |
|---|---|---|
| 3,801,792 | 4/1974 | Lin . |
| 3,900,737 | 8/1975 | Collier et al. . |
| 4,438,453 | 3/1984 | Alston . |
| 4,445,041 | 4/1984 | Kelly et al. . |
| 4,477,729 | 10/1984 | Chang et al. . |
| 4,498,010 | 2/1985 | Biechler et al. . |
| 4,547,712 | 2/1985 | Whitney . |
| 4,620,288 | 10/1986 | Welmers . |
| 4,868,587 | 9/1989 | Loce et al. . |
| 4,879,605 | 11/1989 | Warkentin et al. . |
| 4,956,650 | 9/1990 | Allen et al. . |
| 4,963,990 | 10/1990 | Henderson et al. . |
| 4,992,668 | 2/1991 | Swetman . |
| 4,992,804 | 2/1991 | Roe . |
| 5,103,101 | 4/1992 | Berglund et al. . |
| 5,126,759 | 6/1992 | Small et al. . |
| 5,138,337 | 8/1992 | Ng . |
| 5,196,376 | 3/1993 | Reche . |
| 5,204,699 | 4/1993 | Birnbaum et al. . |

FOREIGN PATENT DOCUMENTS

4022732A1  2/1992  Germany .

Primary Examiner—Bruce C. Anderson
Attorney, Agent, or Firm—Skjerven, Morrill, MacPherson, Franklin, & Friel

[57] ABSTRACT

A raster scan lithography system is modified so that the duration of illumination (dose modulation) for particular pixels is varied to lie between the full on and full off normally used. For instance, three levels of pixel intensity are provided, 100%, 70% and 30% (in addition to off which is 0%). The 30% and 70% pixels are used along the edge of a feature so as to locate the edge when written in between the lines of the cartesian raster scan grid. Thus the edges of the feature are moved off the grid, without the need for multiple passes. This pixel dose modulation uses three preset delay lines determining dwell times for each pixel on a pixel-by-pixel basis, as defined by a two (or more) bit deep memory file associated with the pattern to be written. Additionally, the pixel center locations are directly moved off the grid by deflecting the beam as it scans certain pixels located along feature edges. The amount of deflection is controllably variable to achieve various edge locations. This deflection is used by itself or in combination with dose modulation, and is implemented by an electrostatic deflector in the beam lens for an E-beam system.

33 Claims, 13 Drawing Sheets

DOSE MODULATION AND PIXEL DEFLECTION FOR RASTER SCAN LITHOGRAPHY

BACKGROUND OF THE INVENTION

1. Field of the Invention

This invention relates to raster scan lithography as used for producing masks and wafers for integrated circuit fabrication, and more specifically to raster scan electron beam systems.

2. Description of the Prior Art

It is well known to use particle (electron or ion) or light beam exposure systems for the manufacture of microminiature electronic devices (integrated circuits). Often these systems use raster scan beam lithography methods. Such lithographic employing a controllable electron beam, sometimes called E-beam machines, for fabrication of integrated circuits are well known; one such system is described in U.S. Pat. No. 3,900,737 to Collier et al. and an other in U.S. Pat. No. 3,801,792 to Lin.

In these machines a medium of resist (or photosensitive) material upon which the electron beam is to perform its writing operation is provided overlying a substrate which is to become a mask for imaging a wafer or which is the wafer itself (direct writing). The medium with its underlying substrate is positioned on a motor-driven stage which is moved continuously in synchronism as the beam is scanned in a raster fashion (a raster scan) and in a direction perpendicular to the stage motion. In practice, the diameter of the round electron beam spot, also called a "Gaussian spot" or "pixel", focussed on the resist layer, is of the order of (but not necessarily equal to) the writing address dimension (or address unit) of the cartesian grid on which it is written. Adjacent rows of pixels in the stage travel direction define the width of a "feature" and a length of the feature is formed by a number of pixels in the raster scan direction. The feature is for instance an element of the integrated circuit such as a conductive interconnect or a portion of a transistor. In practice, adjacent "on" pixels in the same raster scan are not separately scanned; instead the beam is kept on until an "off" pixel is encountered. For the purposes of this disclosure, descriptions are given in terms of the normal full pixelization representation. The turning on and off of the beam is achieved by a beam blanker which is a well known portion of an E-beam machine, one example of which is shown in U.S. Pat. No. 5,276,330, patent application Ser. No. 07/706,612, filed May 29, 1991, entitled "High Accuracy Beam Blanker" incorporated by reference herein, invented by Mark A. Gesley. The pattern on the resist defined by the beam scan and by the stage movement is determined by the system control equipment which includes certain computer software programs.

Several modifications of this system are used to achieve feature edge position increment which is finer than the raster grid, i.e. the edges of a feature fall between the center points of the cartesian grid defined by the pixel centerpoints. One example of such a system is described in Berglund et al., U.S. Pat. No. 5,103,101 incorporated by reference and defining a system for multiphase printing for E-beam lithography. Another such system is described in U.S. Pat. No. 4,879,605 to Warkentin et al. for a rasterizing system using an overlay of bit map low address resolution databases, using a multi-pass laser beam writing technique to vary the dosage at a feature edge dependent upon the desired location of a given edge.

Another relevant disclosure is U.S. Pat. No. 4,498,010 to Biechler et al. which provides a virtual addressing technique and is incorporated by reference.

The above disclosures are directed to raster scan methods using a bit map of an image of the feature to be written, in which each pixel is typically either on or off. In contrast, in vector scan lithographic machines, shapes are defined in a stored image. It is well known in vector scan machines to alter the dosage (intensity) of a particular shape.

However the above referenced prior art does not provide, in the context of raster scan, a method for defining an edge of a feature to lie between pixel centers, i.e. to move the edge of the feature off the pixel grid, except by (1) use of multi-scan passes or (2) using virtual addressing to turn complete pixels on or off, producing unwanted edge roughness and pattern distortion. Each such pass requires a significant amount of time and hence reduces throughput of a raster scan machine, thus increasing the cost of the masks or integrated circuits formed thereby.

Warkentin et al. discloses in FIG. 7b (see col. 5, beginning at line 49):

By reducing the dosage of the light source as shown by graph 708, only desired area 705 is exposed to the exposure threshold level 703(b).

FIG. 7b shows the edge of a feature 702(b) in which the dosage of the laser beam source is reduced (modulated) for area 705 of the image. Warkentin et al. changes dose by reducing laser intensity.

Moreover, Warkentin et al. does not indicate that such an approach is suitable, and instead teaches the approach as shown in their FIG. 7c in which the level dose is reduced for all pixels exposed in one pass which are therefore of uniform intensity. Multiple passes of the beams, i.e. multiple scans, are used (see col. 5, lines 54 through 58.) Thus, Warkentin et al. teach a multi-pass system with the attendant reduction in throughput.

SUMMARY OF THE INVENTION

Three methods and associated apparatuses each achieve a finer effectual grid size than the actual writing grid of a raster scan system:

1) Pixel intensity (dose) modulation through blanker pulse width modulation.

2) Sub-pixel deflection for modulating feature edge position.

3) A combination of dose modulation and sub-pixel deflection to optimize the integrity of the written pattern and minimize the disadvantages of dose modulation and pixel deflection.

For a raster scan lithography system, the capability is provided to set (modulate) the dose of individual pixels to a known level on the fly on a pixel-by-pixel basis using pulse-width modulation at high speed, for the purpose of moving an edge of an image feature away from the pixel center-to-center cartesian grid. This is achieved using pulse-width modulation without reducing the beam current density. (Reducing current density is problematic for E-beams).

This is done in a single pass scan by selectively reducing the duration of the pulses defining the individual pixel duration. In one embodiment this is accomplished by adding circuitry to the beam blanker control electronics which provides a number of preset delay values for both the leading and trailing edge of the pulses defining the duration of each pixel. (These pulse edges are not to be confused with the feature edges). These leading and trailing pulse edge delays result in a number of preset pulses with varying pulse widths, providing a variable (modulated) dose per pixel.

In accordance with one embodiment of the invention, in addition to the conventional 100% "full" duration pixel representing a full dose, and the conventional 0% duration representing absence of an exposed pixel, two additional user definable pixel dose levels are provided, e.g. one being about 30% of the duration of nominal and the second being about 70% of the duration of nominal. Thus, a set of delay elements in the beam blanker control electronics are activated by e.g. a two bit data signal associated with each pixel indicating which of the four pixel durations (0%, 30%, 70% or 100%) are to be assigned to each pixel.

Advantageously, this method is applicable to the prior art multi-phase printing and virtual addressing systems described above. In accordance with one application of the present invention, the pixel dose modulation is somewhat similar in result in terms of the written feature to the above described virtual addressing, in that the writing of the image can be done on an address grid three times as large as the design grid by using the two additional modulated dose levels. Thus, the edges of the written feature that fall at about ⅓ or ⅔ of the writing cartesian grid are exposed respectively for instance at 30% pulse duration of nominal or 70% pulse duration of nominal. This approach provides a feature having the high definition of normal raster scan printing with a nine times improvement in throughput, since one can use a three times larger writing grid than is required in the prior art. The same advantage obtains over the multi-phase printing process wherein the medium must be exposed in four passes (the stage travel is repeated three times). Additionally, the method in accordance with the invention minimizes edge roughness of the written feature, compared to virtual addressing which has a characteristic undesirable edge roughness artifact. Advantageously, beam size does not need to be expanded, since there are no "missing" pixels unlike the case with virtual addressing. Additionally, the dose modulation method in accordance with the invention minimizes corner rounding of features commensurately with address unit used during writing, unlike the prior art methods.

In an example of the throughput advantage of dose modulation for a typical mask for a 256 Mbit DRAM integrated circuit (IC) at a 0.025 micrometer address grid, a typical chip size is 70×125 millimeters. Thus the number of pixels is $1.4 \times 10^{13}$ for one IC die. At a 320 MHz pixel rate, the exposure time is thus 12 hours for one pass writing at 1 Hz/pixel. However, dose modulation reduces this exposure time to 1.3 hours assuming three dosage modulation levels.

A second method in the context of raster scan lithography for defining an edge of a feature to lie between pixel centers, i.e. to move the edge of the feature off the pixel grid, does so directly during pixel writing by deflecting the beam so that the pixel centers are displaced by a variably preselected amount from the normal pixel grid center positions. Pixel deflection is typically limited to less than plus and minus one-half of an address unit. In one example the various displacement amounts are equal to the address unit (the nominal pixel diameter), 70% of the address unit, 50% of the address unit, and the conventional zero displacement. This deflection of the actual pixel locations achieves some of the same advantages as described above for dose modulation such as reducing corner rounding. Thus the position of the pattern edges, i.e. feature edges, is changed directly relative to the raster grid.

Pixel deflection allows feature edge positions to be moved in increments less than the address grid. However, in doing so there is an effective dose modulation, because adjacent pixels overlap their intensities differently when their spacings are changed. If uncorrected this results in error in edge position and/or degradation of process latitude. This problem can be corrected in several ways combining dose modulation and deflection, but other schemes such as deflecting all pixels within three or four pixel spacings of the edge exactly the same amount are applicable.

Pixel deflection is achieved in one version by deflecting only along the X direction in the scan (the scan conventionally defining both X and Y directions) with a maximum deflection of one-half pixel length. More generally the deflection is in both the X and Y directions. Adjacent pixels may have different deflection amounts depending on the feature edge position needed. An apparatus for achieving deflection is to use two matched impedance electrostatic beam deflectors (one for each deflection direction X and Y) in an E-beam raster scanning system. Thus the objective lens portion of the system is modified to provide for the needed pixel deflection, under computer control.

Pixel deflection may also be used in combination with dose modulation, whereby particular pixels are modified both by (1) having less than 100% of the maximum dose and (2) having their centers deflected from the normal position. The combination is especially advantageous in providing better definition of feature edges, including achieving symmetrical corner rounding independent of corner position relative to nominal pixel centers while maintaining process latitude. (Process latitude refers to change in line width or edge position due to dose variation, or development time variation) This approach therefore maintains the steepness and integrity of the edge dose profile versus position, independent of feature edge position relative to nominal address grid.

DETAILED DESCRIPTION OF THE INVENTION

Dose Modulation

Typically in raster scan electron beam photolithography machines (and also those using other types of beams, such as light or ions) the current delivered to the substrate to be written to (imaged) is fixed at a certain level and is only changed with a new pattern data file defining a new mask or die or between writing passes. As described above, dose modulation in accordance with the invention is useful for proximity effect correction and optical proximity correction where the feature to be written has edges which require biasing in order to maintain a uniform line width, i.e. the edges of the feature do not lie along the boundaries halfway between adjacent pixels.

Therefore, in accordance with the invention the beam blanker control electronics are modified to include pulse timing delays determined by a tappable delay line, the selection of the amount of delay being under computer control (called an "autotap") so that the edges of the blanking control pulses are moved in time (and hence space) relative to the raster grid to minimize the X-axis versus Y-axis critical dimensions of the written images. Thus, one achieves variable pulse widths for each pixel on a selective basis in order to control the pixel dose, i.e. the amount of irradiation or particles impacting on the substrate anywhere within the scan pattern maintained by a high speed rasterizer (a raster engine where the bit map representation of the feature or pattern is stored prior to the exposure).

Figure 1:
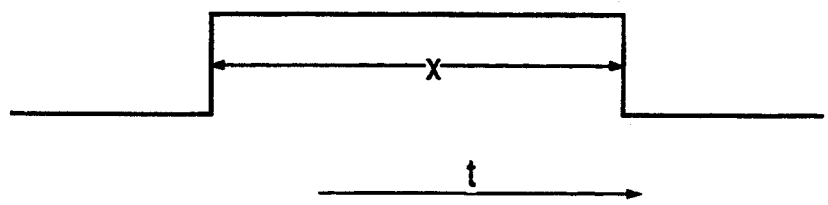
FIG. 1 shows an ideal control pulse waveform for the blanker electronics of a raster scan E-beam photolithography machine.

As is conventional, the blanker electronics which effectively turn the electron (or other) beam on and off are driven by a control pulse as illustrated in FIG. 1. When the pulse is high this deactivates the blanker to define (illuminate) a pixel on the medium to be written to. The horizontal axis represents time t, and the pulse has a nominal width (duration) of X which is inversely proportional to the writing rate. Thus, for a writing rate of 40 MHz the value of X is 25 nanoseconds, for 80 MHZ rate the value of X is 12.5 nanoseconds, and for 160 MHz rate the value of X is 6.25 nanoseconds.

When a clock pulse of FIG. 1 is received by the blanker electronics, the blanker electronics, in accordance with a second data input signal which controls the pulse duration, delays either or both of the leading or trailing edges of the pulse based on a preset value that the system user determines based on, for instance, experimental data to achieve optimum feature edges. The experimentation involves the resist type, process, and dose to make the X vs. Y critical dimensions (CD) the same. Since the X-axis CD is determined by the resist, dose, and process, the only degree of freedom is the Y-axis by controlling the shape width. Alternately, the delays are determined by simulation, or a simple linear approximation of edge placement from the pixel boundaries being proportional to the dose.

Therefore, a number of user preset delay values are provided in the pulse blanker control electronics to control the time of occurrence of both the leading and trailing edge of each pixel activation pulse in the blanker electronics. These leading and trailing pulse edges result in a number of preset pulses with varying pulse widths available. This provides a variable dose per pixel. The proper pulse width per pixel is selected by modifying the pattern memory in the high speed rasterizer to e.g. a 2 bit (or more) deep bit map representing for example four "gray" levels.

Figure 2:
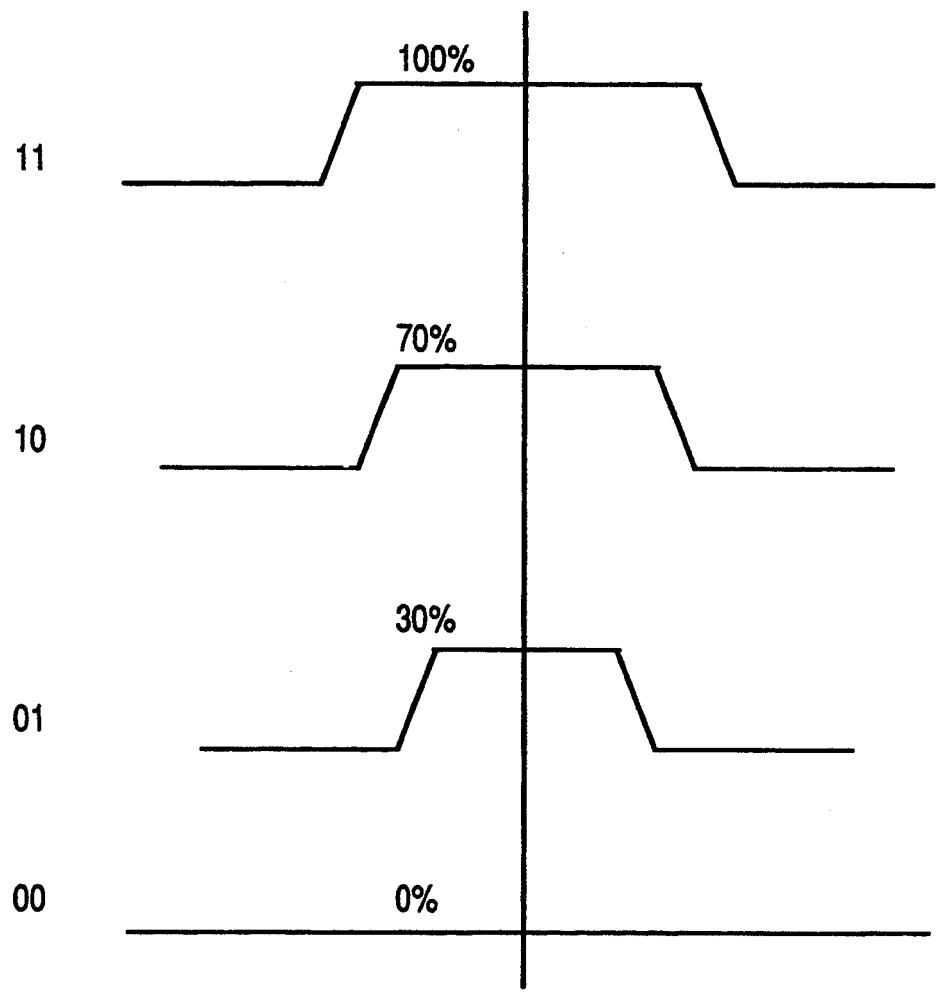
FIG. 2 shows wave forms illustrating various modulated beam blanker pulse widths in accordance with dose modulation.

This is illustrated in FIG. 2 where the Data column indicates the two data bits for determining pulse width, i.e. modulating the pulse, and the associated right hand waveforms illustrate the corresponding beam blanker pulse durations varying from nominal 100% duration down to off (0% duration.) The intermediate durations 30% and 70% here are examples. The actual values are determined by experimentation to achieve the optimum image result. From signal to noise arguments and the noise characteristics of E-beam gun technology, it has been determined that the number of useful dosage levels is 10 for dosage modulation by itself and 17 for dosage modulation combined with pixel deflection.

Figure 3:
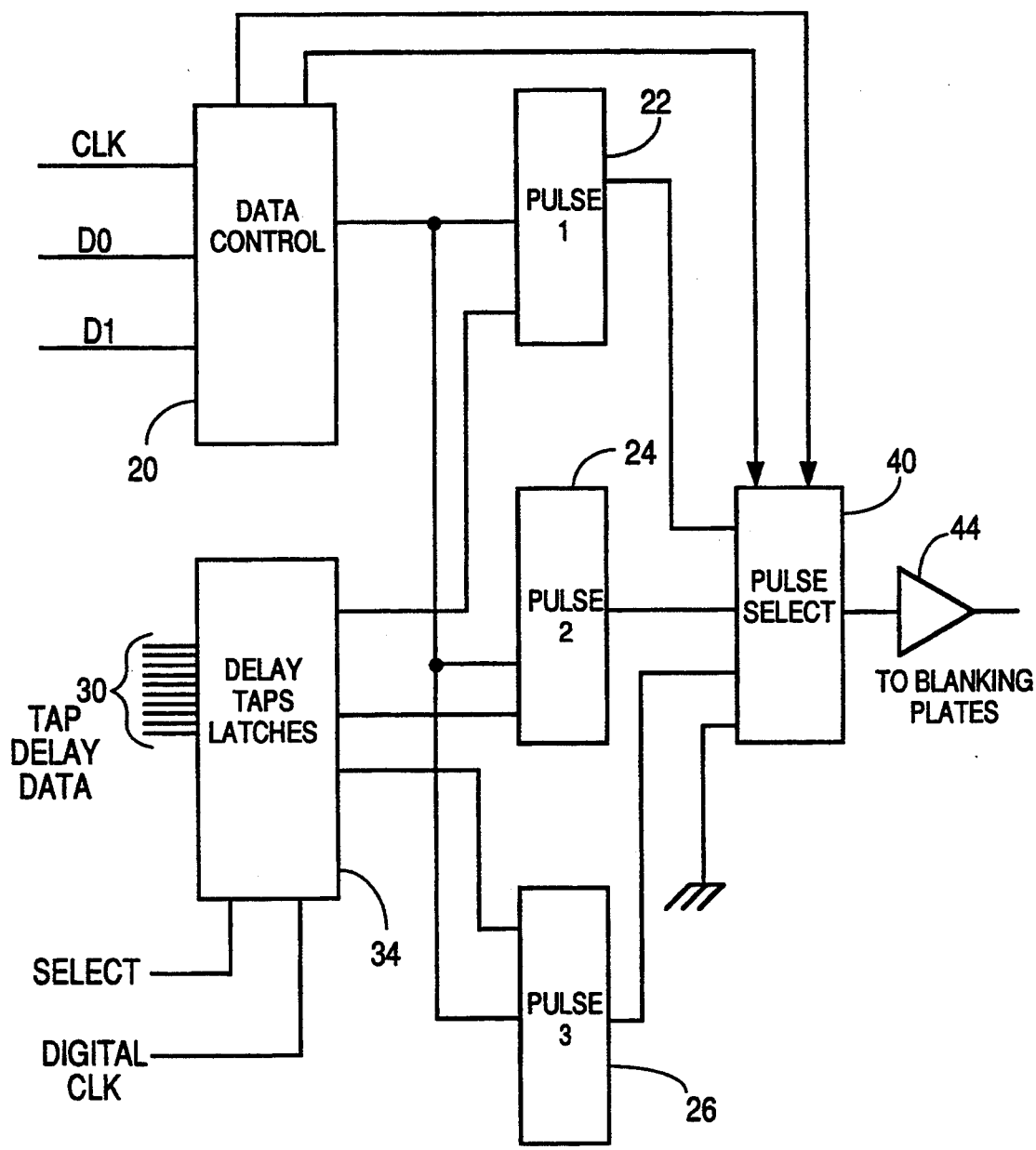
FIG. 3 shows control electronics in block form for beam blanker electronics for dose modulation.

The waveforms of FIG. 2 are achieved in one embodiment by the apparatus of FIG. 3, which allows the user to select the desired beam blanker pulse duration per pixel. The blanker control electronics include a data control section 20 which receives both a conventional clock signal determining the writing rate and in this case a D0 and a D1 (extendable to DN) signal, which are the number N data bits shown in the left hand column in FIG. 2. The blanker electronics also includes three (N−1) sets of pulse generators 22, 24, 26 (here also labelled pulse 1, pulse 2 and pulse 3). Each set of pulse generators has two controls, one for the pulse leading edge and one for the pulse trailing edge. Each pulse generator 22, 24, 26 can be addressed separately by the data control section 20. The user sets each pulse generator 22, 24, 26 in accordance with the best results taken from experiments for his particular E-beam machine, photoresist medium, and other relevant process factors (or alternatively by simulation or linear approximation).

The input DIGITAL CLK signal drives all three pulse generator sets 22, 24, 26 as shown thus allowing stable pulses at all times. Selection of which pulse width will be used for a particular pixel is done by a circuit (not shown) which delivers the two bits of data D0, D1 to data control section 20 along with the blanker clock signal.

Thus the pattern memory in the high speed rasterizer is duplicated as compared to conventional practice to provide the two bit deep memory storing data D0, D1 indicating the pulse width for each pixel. The system computer programs (otherwise conventional) are modified (in a manner apparent to one of ordinary skill in the art in accordance with this description) to support this procedure.

As shown in FIG. 3, the durations of each of the three pulse widths for pulse 1, pulse 2 and pulse 3 are variable and are determined by the user by providing tappable delay line data via lines 30 to the tappable delay line latches 34 which in turn communicate the duration of the particular pulse needed to the three sets of pulse generators 22, 24, 26. Also provided is a select control signal and a digital clock signal to the tappable delay line latches 34, to load the desired pulse width information in each latch.

The outputs of each of the three pulse generators 22, 24, 26 are provided to a high speed pulse select circuit 40 which delivers the appropriate pulse to the beam as needed. The pulse select circuit 40 then in response to the clock signal and the two data signals D0, D1 from data control section 20 selects which of the three sets of delay pulses will be provided to the output amplifier 44 which in turn drives the blanking plates (not shown) in the conventional blanker.

It will be understood that other circuitry will also provide dose modulation in accordance with the invention.

Figure 4A:
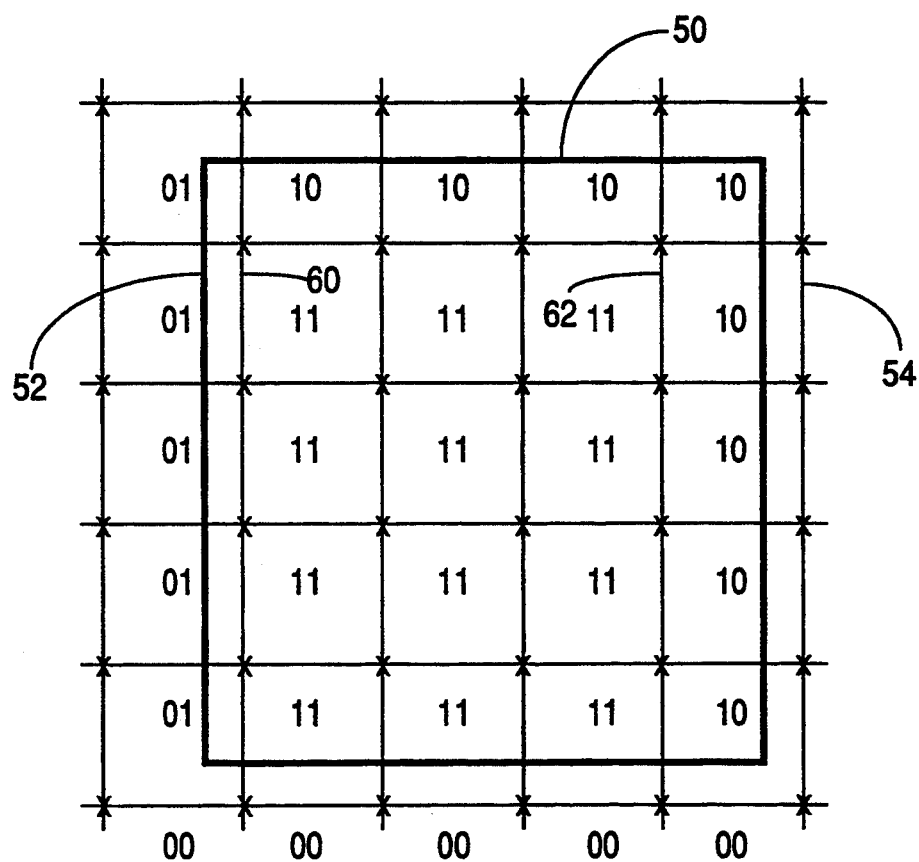
FIG. 4a illustrates numerically a mask or IC feature written using dose modulation.

A typical feature written using dose modulation is numerically represented in FIG. 4a, where the small X's denote intersections of the perimeter lines (light horizontal and vertical lines) defining the pixels. The dose value of each pixel is shown digitally in accordance with FIG. 2. The heavy line 50 is the outline of the desired feature. Note that the left edge 52 of the feature is placed by setting the dose for that column of pixels at 30% (01) and the right edge 54 determined by the 70% dose pixels (10). Thus the left edge 52 is spaced approximately ⅓ of the way from the nearest adjacent right grid perimeter line 60, and the right edge 54 of the feature is spaced approximately ⅔ of the way from the nearest adjacent left grid perimeter line 62. Thus, one has provided well defined edges 52, 54 to the feature which lie between the cartesian grid perimeter lines of the raster.

Figure 4B:
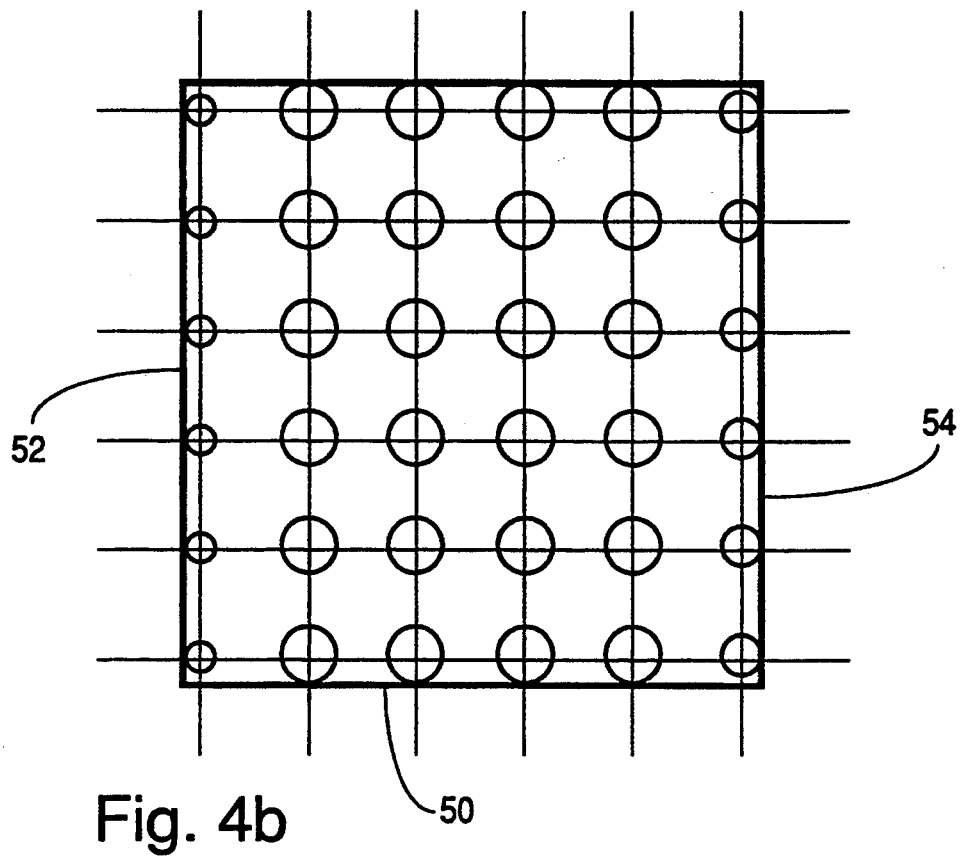
FIG. 4b illustrates pictorially a mask or IC feature written using dose modulation.

Another depiction of the feature of FIG. 4a is shown in FIG. 4b where the relative image intensity of each pixel is shown as the pixel diameter. In FIG. 4b the pixels (circles) are shown centered on the raster grid center points. Also, FIGS. 3, 4a, 4b are representations of the pattern data in the pattern memory. It is to be understood that in reality, where pixel modulation is achieved by controlling pixel exposure (dwell) time, the actual pixel images would be of normal size (beam diameter) in the direction perpendicular to the scan, and shorter in the direction of the scan. Thus in FIG. 4b, the pixels of the left edge 52 are very small (30% of normal), and then at the right edge 54 and somewhat small (70% of normal). The resulting feature outlines as shown.

The above described dose modulation can be used in accordance with a stripe butting approach for adjacent stripes which form one feature using stripe overlapping, where the overlap area is for example ⅓ to ⅔ dosed in accordance with the present invention. This will have the benefits of the well known scan offset voting without the overhead (repeated passes) associated with writing the entire pattern area multiple times. See copending and commonly assigned U.S. patent application Ser. No. 08/069,268, filed May 28, 1993 entitled "Gray Scaled Dosing for Lithography" invented by John Poo et al.

Pixel Deflection

Figure 5:
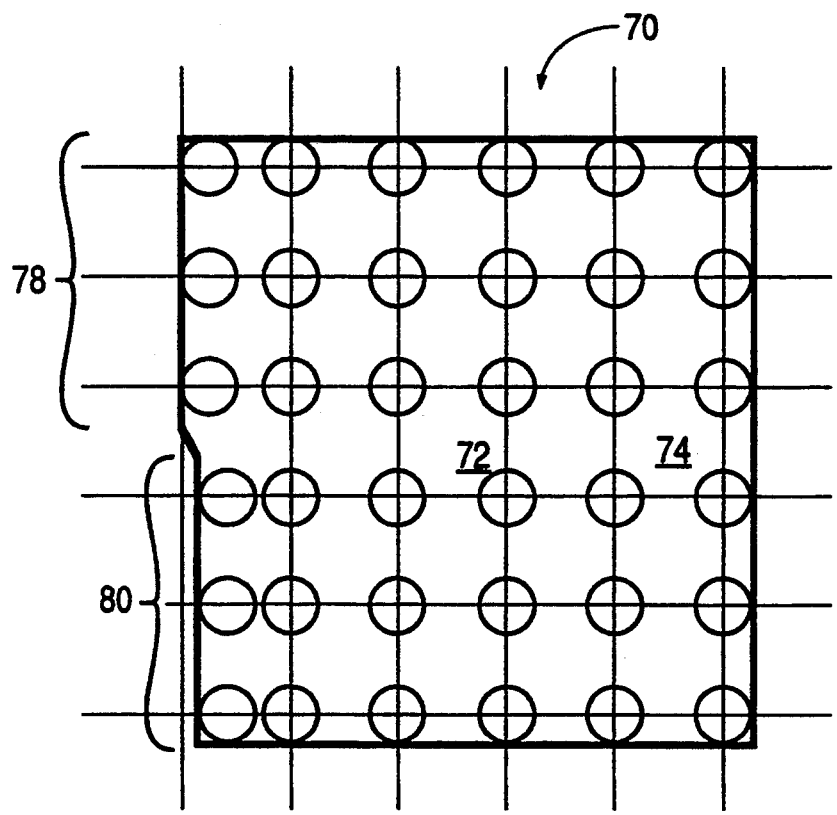
FIG. 5 illustrates pictorially a mask or IC feature written using pixel deflection.
Figure 6A:
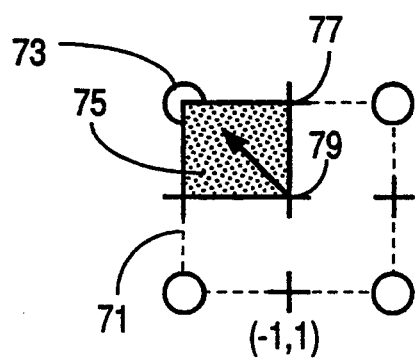
FIGS. 6a, 6b, 6c, 6d show deflection unit vectors.
Figure 6B:
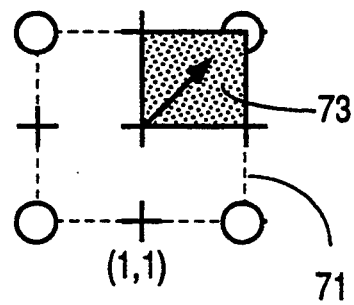
Figure 6C:
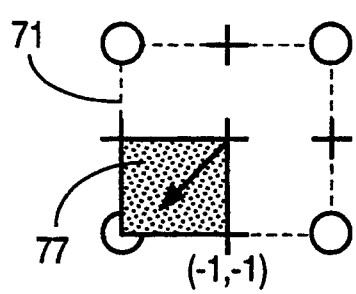
Figure 6D:
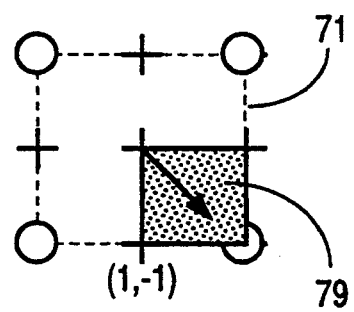

A feature written using one embodiment of pixel deflection is illustrated in FIG. 5. The pixels in the interior 72 and righthand 74 portion of the feature outlined by line 70 are located at the normal raster cartesian grid points. However, the pixels located along the left edge of the feature are deflected (moved) from the normal grid points rightwards by a variable amount so as to define the left edge of the feature to lie off the normal raster grid. The pixels in the upper portion 78 of the left edge are deflected less than are the pixels in the lower portion 80 thereof. This pixel deflection thereby achieves the advantages of dose modulation, without the need to change the pixel exposure durations. Advantageously the E-beam effective current does not have to be modulated with pixel deflection alone.

It is to be understood that in other embodiments, one would displace all pixels linearly from one edge of a feature toward its opposite edge. Also, in yet another embodiment one would displace N adjacent pixels near each edge exactly the same amount, where N=2, 3, or 4 for example.

Pixel deflection can be done in one (x,y) direction, with reduced effectiveness, or in both directions. The implementation of deflection for the two directions can be different. For example, in the scan direction the deflection can be achieved with turn-on and turn-off modulation alone, rather than by electrostatic beam deflection.

In one embodiment, pixel deflection is achieved by a particular type of pattern processing for raster scanning. For data processing purposes, the design pattern defining the feature is composed at an address unit of one half of the writing address unit (the normal cartesian grid spacing). For the actual writing process, the address unit size is doubled, to its normal size. The relation of the design pixel (child) and the writing pixel (parent) is shown in FIGS. 6a, 6b, 6c, 6d where the circles are the corner points of the parents and the crosses are the children. Each of FIGS. 6a, 6b, 6c, 6d display the same parent pixel, but highlighting a different child pixel. At each parent pixel, e.g. pixel 71, the vector sum (arrows) of the intersecting child pixels 73, 75, 77, 79 is calculated. The coordinate pairs, e.g. (−1, 1) represent the four unit vectors of deflection. This sum is mapped into the intensity value at which the pixel is exposed (as described below). For pixel deflection used without dose modulation, this intensity value is the full pixel intensity value. The direction of the deflection is given by the direction of the vector sum of the constituent child pixels interacting with the parent.

Figure 7:
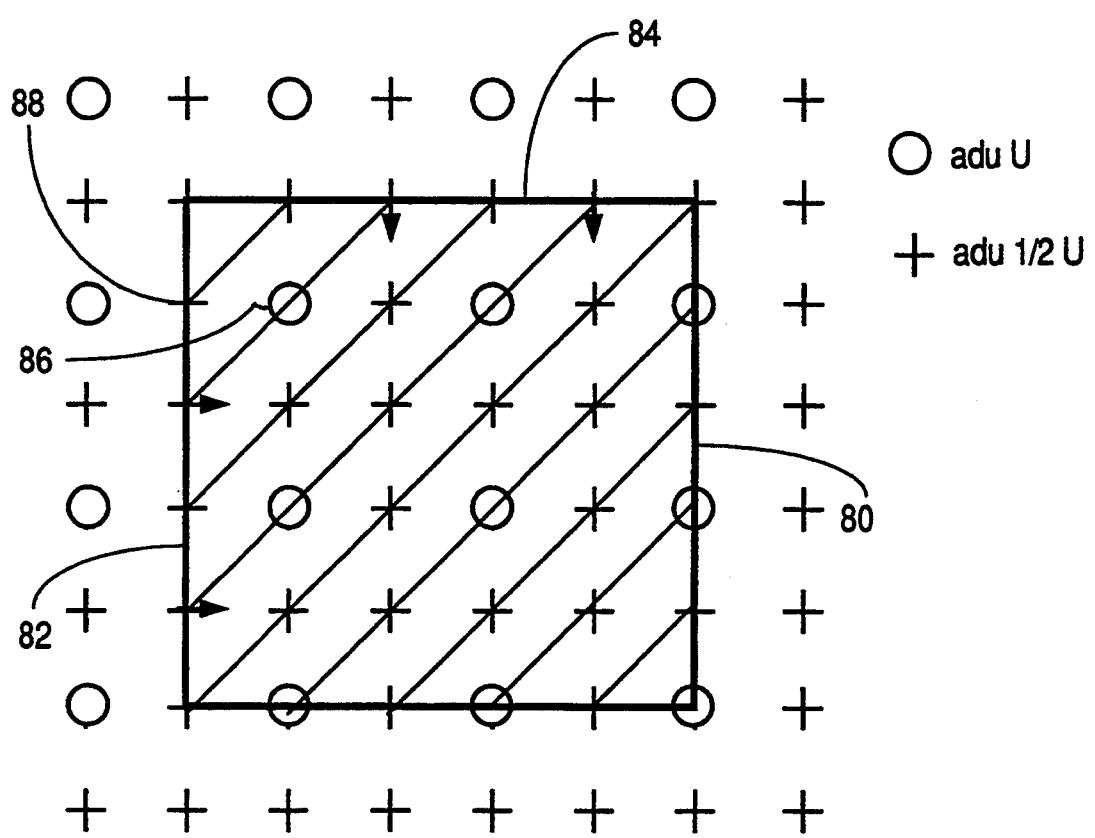
FIG. 7 shows deflection assignments at the parent grid pixels.

The amplitude of the deflection is a function of the sum of the number of constituent child pixels and possibly the pixel configuration. Additional improvements to the positioning of the pixel could be done, if the arrangement of the neighboring pixels is considered. The needed deflection is typically inversely related to the sum of the number of constituent configuration. An example of a feature pattern defined by outline 80 and the corresponding deflection of each parent is shown in FIG. 7. As shown here, the left 82 and top 84 edges of the feature 80 are extended beyond the parent pixels, e.g. pixel 86, by ½ of the writing address unit to the adjacent child pixel 88.

A generalization of the deflection method allows calculation of the overlap area of the parent pixel with angled lines and assigns a displacement corresponding to the overlap area and assigns a location of the parent pixel. This allows elimination of the staircase effect for angled feature edges than one might obtain for instance with dose modulation.

The reduction in or decoupling of the allowable feature edge increment from that of the address grid is a particular implementation here. Benefits can also be achieved for this method by keeping the original grid and using the pixel deflection technique to reduce critical dimension variation on angled feature edges, or using edge smoothing algorithms (such as computer graphics antialiasing algorithm) at feature edges as is well known in the art.

Pixel deflection is used during writing of feature edge pixels in the x direction and may be used in the y (scan) direction as explained below. The maximum deflection typically is one half pixel length in any direction, and adjacent pixels may have different deflection amounts. The precision of the deflection is dependent on the number of edge placements that are used; one example would be sixteen edge placements for each pixel in each direction; i.e., 32 displacement gradations between normal pixel centers.

Edge deflection is achieved in an E-beam system in terms of apparatus by an electrostatic beam deflector which is impedance matched to the deflector driving circuit. In one embodiment each deflector includes an offset (off axis) hole drilled all the way through a coaxial transmission line. The electron beam passes through the hole and is deflected by a voltage of particular levels (plus or negative) on the transmission line central conductor; the outer conductor is at ground. One such deflector is provided for each axis (X,Y) in which deflection is to take place. Other electrostatic deflectors are also suitable. These X and Y deflectors are placed in the objective lens of the electron beam system.

Deflection is performed during writing at the start of scan of the beam across a particular pixel. It must be possible to turn the deflection on or off in a time comparable to the write time of a typical feature, usually many pixels in duration. Thus one can start the deflection gradually on pixels that are not written, and turn it off gradually over several pixels that are being written. Typical values for the magnitude of the deflection would be 0, 0.05, 0.07 and 0.1 micrometers for a 0.1 micrometer diameter address unit (pixel diameter).

An alternative method of achieving a kind of deflection in the Y direction is to use pulse offsets. Pulse offsets eliminate the need for the Y-direction deflector by instead advancing or delaying the writing pulse that actuate the beam blanker during scanning; this shifts the pulse center left or right of its normal position. Thus tappable delay lines (in addition to those described above in conjunction with dose modulation) advance or delay (in time and hence space) the pixel writing pulse by a predetermined amount.

Combination of Dose Modulation and Pixel Deflection

The combination of pixel deflection with dose modulation preserves the constant dose density. Moving a pixel's position relative to its nearest neighbors changes the combined dose that occurs in the vicinity of the moved (deflected) pixels. This change in local dose can be compensated for by adding (minor) pixel dose modulation to the deflected pixels, thus achieving the advantages of both pixel deflection and dose modulation. Thus total exposure dose per pattern is constant while maintaining pattern edge slope integrity. Thus process latitude is not adversely affected.

Figure 8:
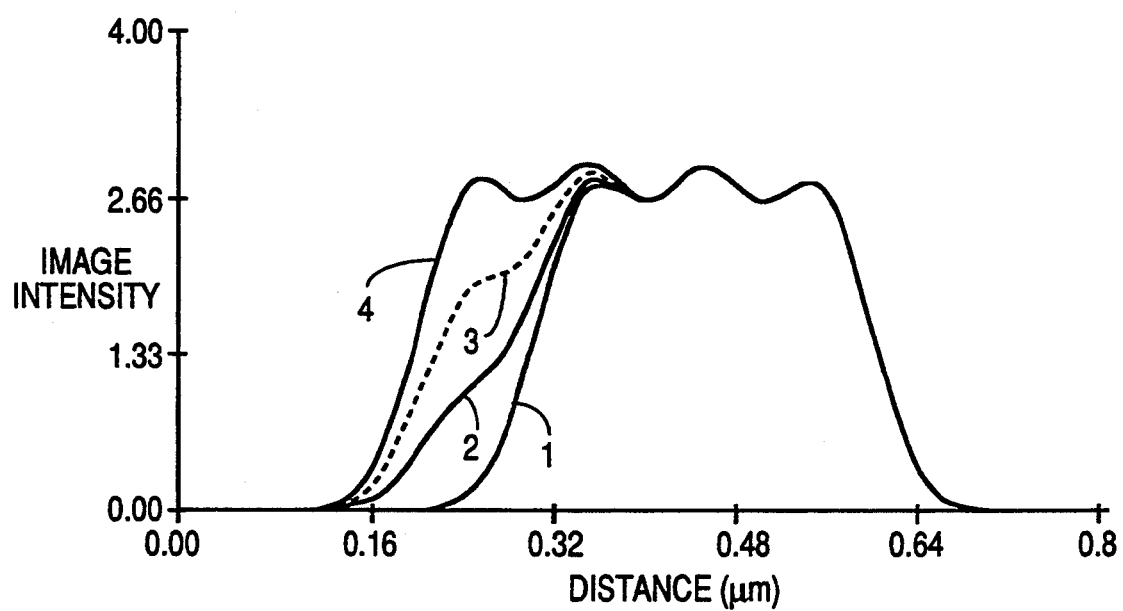
FIG. 8 shows image intensity versus distance for the dose modulation technique used alone.
Figure 9:
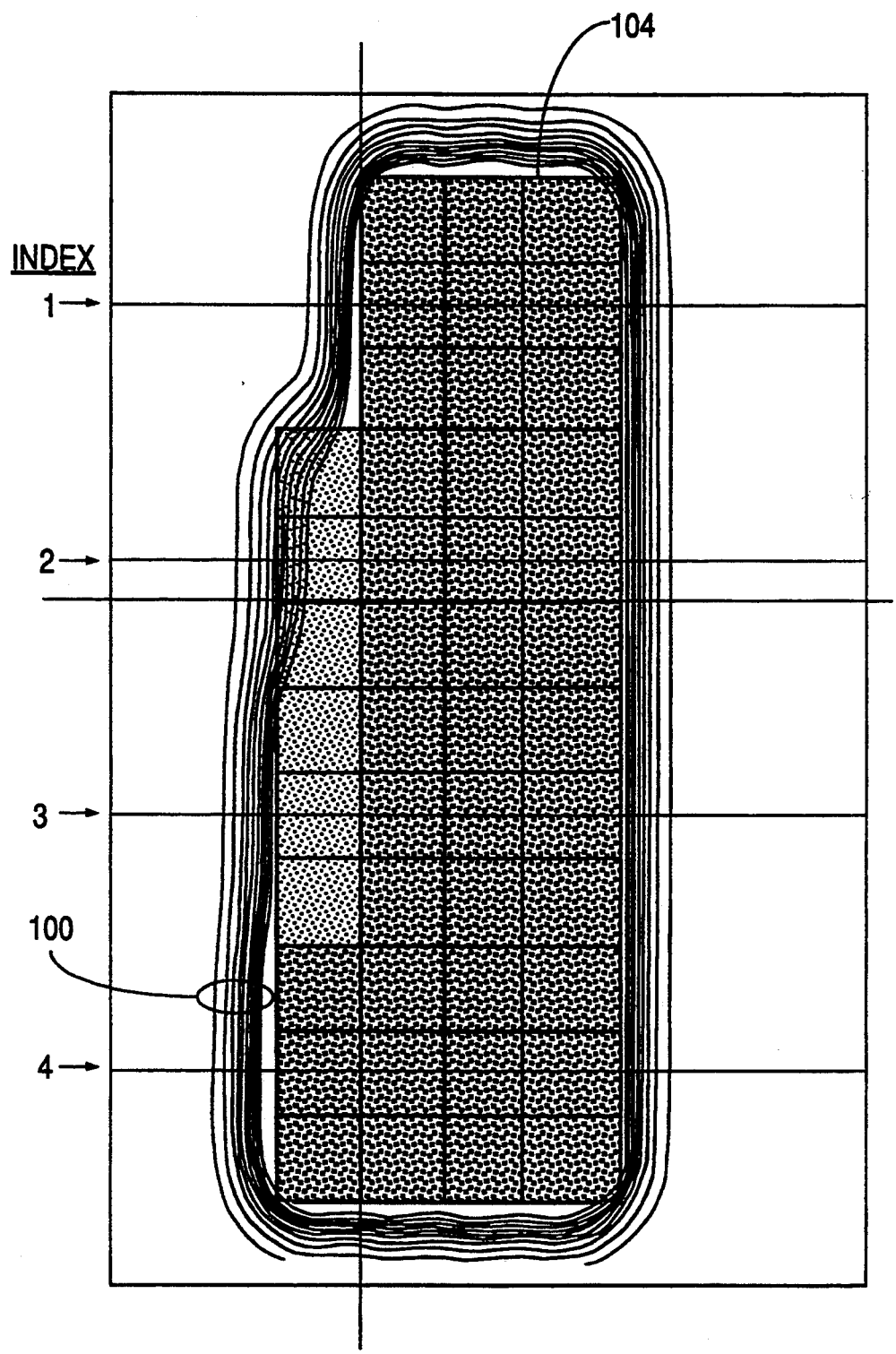
FIG. 9 illustrates a feature written using dose modulation technique showing edge contour intensities.

FIG. 8 shows image intensity (vertical axis) versus distance ($\mu$m) from an arbitrary vertical line to a vertical feature edge for dose modulation, given a four pixel wide line (and assuming scanning in the Y-direction). Varying doses of 0%, 33%, 66% and 100% of the maximum dose correspond respectively to index numbers 1, 2, 3, and 4 for address unit and beam diameter of 0.1 micron. Note that the edge profile changes dramatically as the dose at the edge is varied. This is a significant deficiency. FIG. 9 shows the equal intensity contours 100 of exposure distribution resulting from writing a feature test pattern 104 as shown, where the dose is varied as in FIG. 8 at the left edge of the feature. Note that the horizontal distance between contours increases as the dose at the edge pixels is decreased (bottom to top of feature 104). This may result in reduced process latitude.

Figure 10:
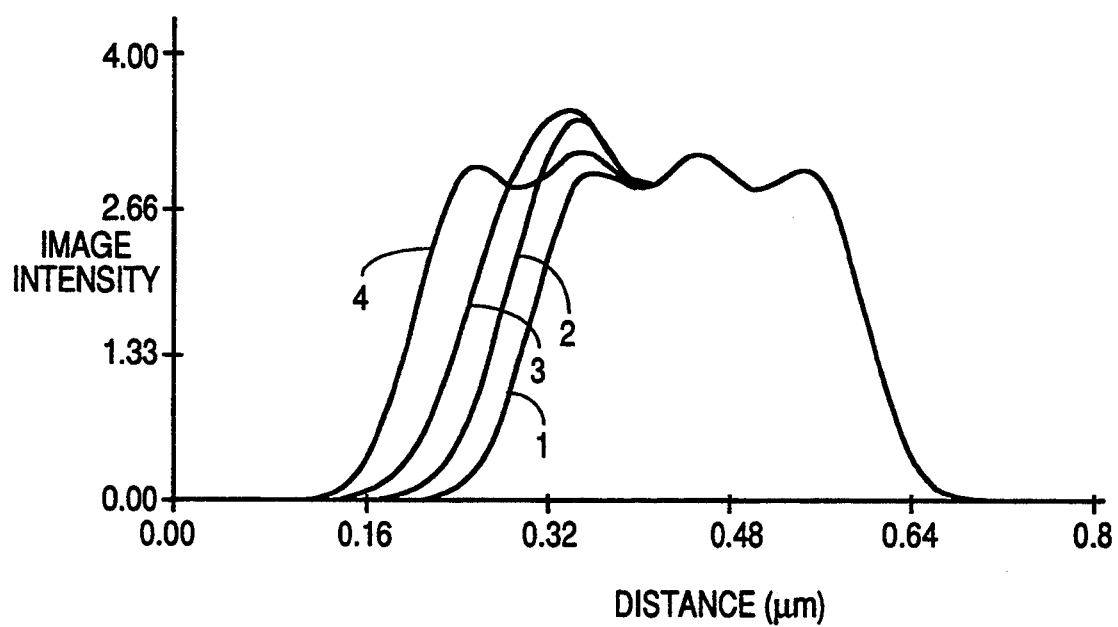
FIG. 10 shows image intensity versus distance for the combination of the dose modulation and deflection.

FIG. 10 shows image intensity versus distance for a four pixel wide line (assuming scanning the y direction) with both dose modulation and pixel deflection as indicated in Table 1 for four combinations of dose and deflection. Note that the edge profile does not change as the edge is displaced. Displacement is measured from the edge of the neighboring pixel.

TABLE 1

Figure 11:
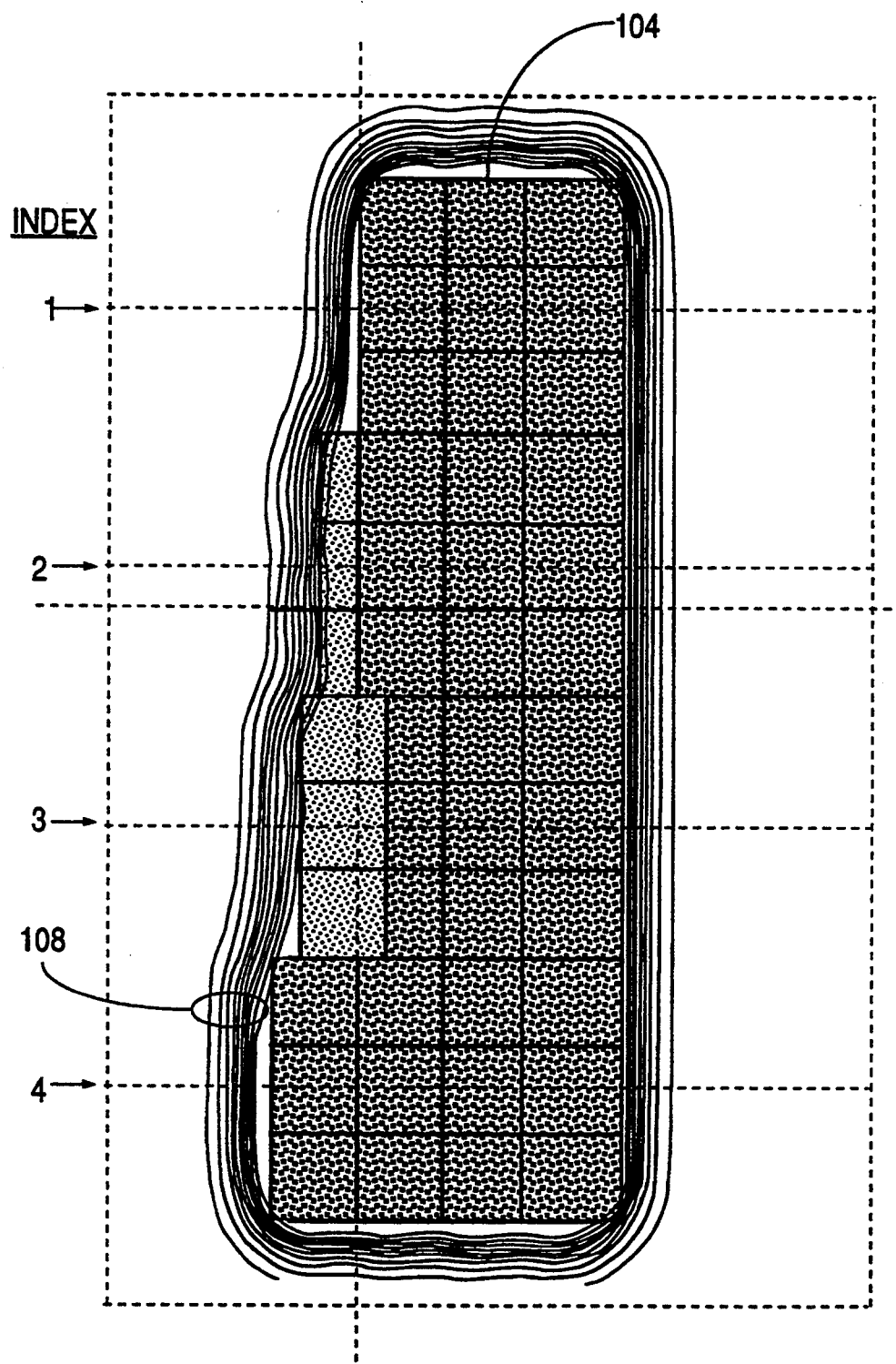
FIG. 11 illustrates a feature written using the combination of the dose modulation and deflection techniques.

(For FIGS. 10 and 11)

| Index | Displacement | Dose | Shift (in Linewidth) |
|---|---|---|---|
| 1 | 0 | 0 | 0% |
| 2 | .05 | 33% | 0.0238 |
| 3 | .03 | 66% | 0.0561 |
| 4 | 0 | 100% | 0.1 |

The Shift value in Table 1 was determined empirically.

FIG. 11 shows the corresponding equal intensity contours of the exposure distributions resulting from writing the feature test pattern 104 shown using dose modulation and pixel deflection corresponding to FIG. 10. The horizontal distance between contours 108 at the left edge of the figure is approximately constant, because the edge is displaced. This desirably results in uniform process latitude.

Figure 12:
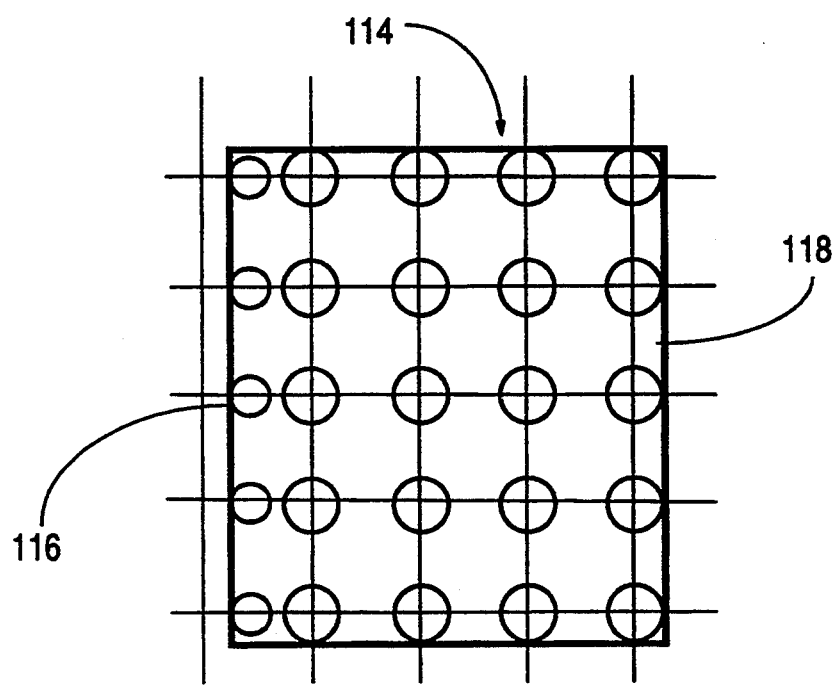
FIG. 12 illustrates pictorially a mask or IC feature written using dose modulation and pixel deflection.

Details of a feature written using combined dose modulation and pixel deflection is shown in FIG. 12; note that the pixels at the left edge 116 of the feature 114 (defined by outline 118) are both of reduced size and shifted off the normal grid centerpoints. In the combined deflection and dose modulation technique, dose modulation is accomplished in the same manner as in dose modulation used by itself.

Figure 13A:
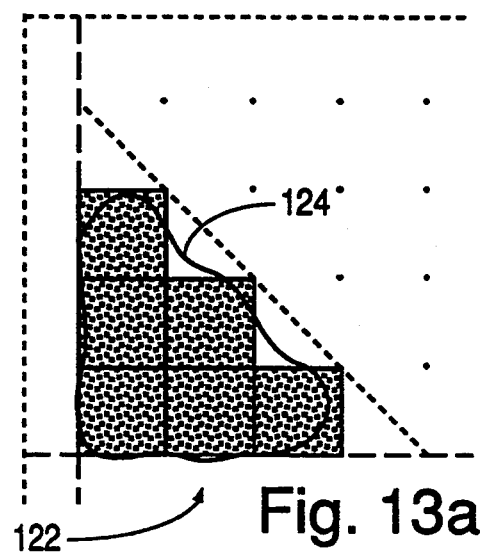
FIGS. 13a, 13b, 13c show pictorially a slanted edge of a mask or IC feature with respectively conventional writing, dose modulation, and dose modulation with pixel deflection.
Figure 13B:
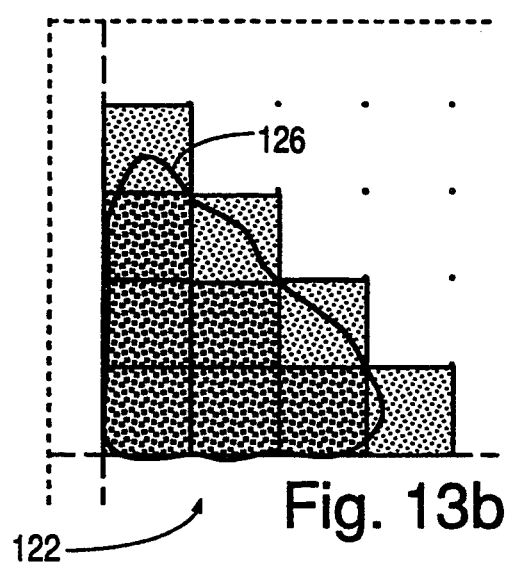
Figure 13C:
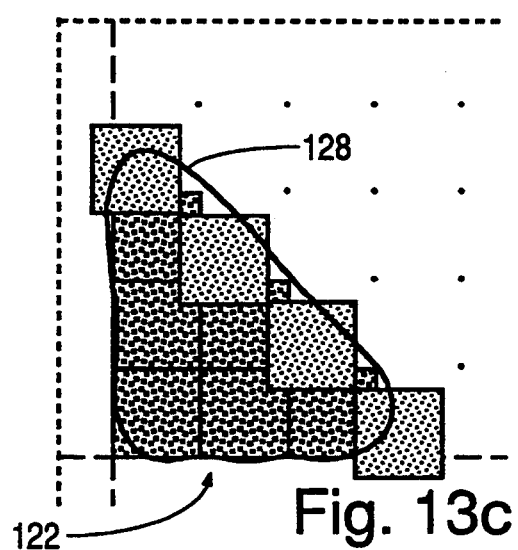

For a further illustration, FIGS. 13a, 13b, 13c show pictorially a triangular feature 122 written respectively using conventional single pass printing, dose modulation by itself, and dose modulation with pixel deflection. The pixels here are represented as contiguous squares. The darker pixels are those with more intense doses. As shown, the perceived edges of each feature 122 is delineated by a line; line 124 of FIG. 13a is non-uniform (uneven). Line 126 of FIG. 13b is closer to the original triangle shape. Line 128 of FIG. 13c is even closer to the original triangle shape, with better uniformity.

Figure 14:
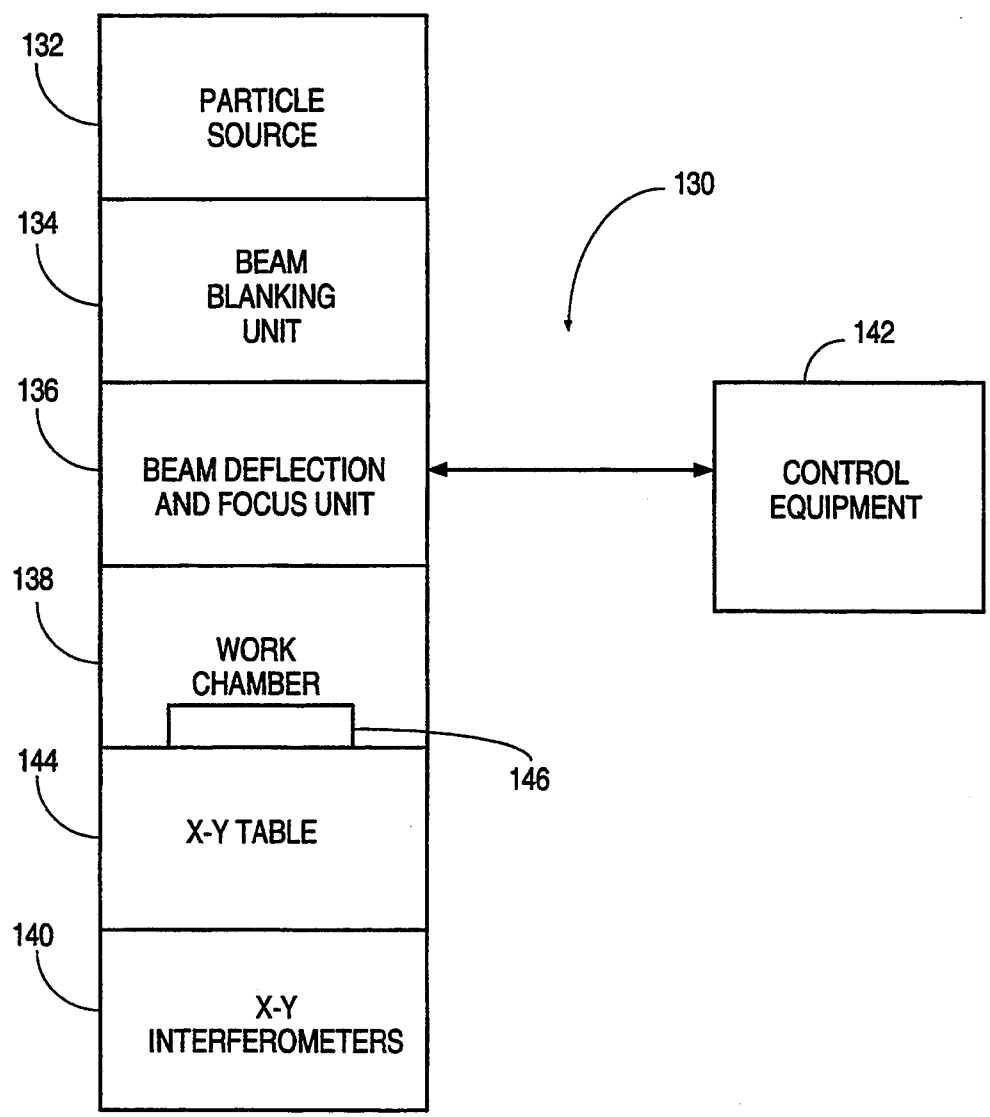
FIG. 14 shows a lithographic system for writing on a resist.

FIG. 14 depicts a particular beam lithographic system 130 (as illustrated in FIG. 2 of above-referenced U.S. Pat. No. 5,103,101 to Berglund et al). This system is utilizable for accomplishing the above writing technique and comprises a particle or electron source 132, a beam modulating or blanking unit 134 for providing the modulation of the beam, a beam deflection and focus unit 136, a work chamber 138 containing the stage 144 (X-Y table) with resist 146 and the x-y interferometers 140 for determining the registration of the beam at the proper coordinates, all under the control of control equipment 142.

The above description is illustrative and not limiting; further modifications will be apparent to one of ordinary skill in the art and are intended to be encompassed by the appended claims.

We claim:

1. A method of exposing a medium which is sensitive to exposure from a beam in a raster scan lithography apparatus, comprising the steps of:
   scanning the beam across a surface of the medium in a raster pattern, thereby exposing a plurality of pixels of the raster pattern on the medium to form at least one exposed feature on the surface of the medium, the feature including the plurality of the pixels and having at least one edge; and
   modulating a duration of the exposure of at least some of the pixels at the edge of the feature by reducing a duration of the exposure of the pixels at the edge compared to the pixels at other portions of the feature, thereby defining the edge of the feature as a line lying off a grid defined by locations of the pixels of the raster pattern.

2. The method of claim 1, wherein the step of modulating comprises:
   predetermining at least three durations of the exposure, one of the durations being zero; and
   selecting one of the at least three durations for each pixel to be exposed.

3. The method of claim 2, wherein the step of predetermining comprises:
   providing a delay circuit having at least two pairs of delays, each having two delays, one delay associated with a beginning one delay associated with a termination of a particular pixel exposure duration.

4. The method of claim 3, wherein the step of selecting comprises:
   providing a timing signal and a duration selection signal to a blanker for blanking the beam; and
   blanking the beam in accordance with the timing signal and the duration selection signal to modulate the duration of the exposure.

5. The method of claim 4, wherein the duration selection signal is a digital signal having at least two digits for each pixel of the plurality of pixels.

6. The method of claim 2, further comprising providing at least three predetermined durations in addition to zero, the durations being 100%, about 70%, and about 30% of a full pixel exposure duration; and further comprising the steps of:
   exposing pixels at the about 70% duration for a particular pixel occurring at an edge of the feature located about $\frac{2}{3}$ of the way between the particular pixel and an adjacent unexposed pixel; and
   exposing pixels at the about 30% duration for a particular pixel occurring at an edge of the feature located about $\frac{1}{3}$ of the way between the particular pixel and an adjacent unexposed pixel.

7. The method of claim 1, further comprising the step of deflecting the beam while it is scanning at least some of the pixels at the edge of the feature, thereby locating the pixels at the edge at locations lying off the grid.

8. The method of claim 7, wherein the step of deflecting comprises:
   predetermining at least two amounts of deflection; and
   selecting one of the at least two amounts for deflecting each of the deflected pixels.

9. The method of claim 8, wherein the step of deflecting further comprises:
   providing an electrostatic beam deflector; and
   controlling a voltage to the electrostatic deflector thereby deflecting the beam.

10. The method of claim 8, further comprising providing at least three amounts of deflection, wherein the at least three amounts of deflection, relative to the center-to-center spacing between undeflected pixels, are respectively about $\frac{1}{2}$, 0.35 and 0.25.

11. The method of claim 7, wherein the raster pattern defines two perpendicular directions, and the step of deflecting includes deflecting along only one of the two directions.

12. The method of claim 11, further comprising deflecting along the other of the two directions.

13. The method of claim 7, further comprising the step of deflecting the beam linearly for all pixels within a feature.

14. A raster scan photolithography apparatus comprising:
   a beam generator;
   a support for a medium sensitive to exposure from the beam;
   a raster scanning system located between the beam generator and the support for scanning the beam across the medium in a raster pattern having a plurality of pixels to expose a feature on the surface of the medium defined by some of the pixels;
   a beam blanker located between the beam generator and the support for blanking the beam, thereby defining the pixels; and
   a beam blanker controller operatively connected to the beam blanker for reducing a duration of the pixels located at an edge of the feature to at least two predetermined levels each intermediate of a zero duration and a full pixel duration.

15. The apparatus of claim 14, wherein the beam blanker controller includes at least two preset delay paths for reducing the duration of the pixels to the two intermediate levels.

16. The apparatus of claim 15, wherein the two preset delay paths define pixel durations of about 30% and about 70% of the full pixel duration.

17. The apparatus of claim 15, wherein the beam blanker controller includes a data control portion for receiving a data signal having at least two digits for determining which of the preset delay paths reduces each pixel duration.

18. A method of exposing a medium which is sensitive to exposure from a beam in a raster scan lithography apparatus, so as to achieve a feature edge location finer than a grid defined by the raster scan, comprising the steps of:
   scanning the beam across a surface of the medium in a raster pattern, thereby exposing a plurality of pixels of the raster pattern on the medium to form at least one exposed feature on the surface of the medium, the feature including the plurality of pixels and having at least one edge; and
   deflecting the beam while it is scanning at least some of the pixels at the edge of the feature, thereby locating the pixels at the edge at locations lying off a grid defined by locations of the remaining pixels of the raster pattern and thereby locating the edge off the grid.

19. The method of claim 18, wherein the step of deflecting comprises:
   predetermining at least two amounts of deflection, one of the amounts being zero; and selecting one of the at least two amounts for deflecting each of the pixels to be deflected.

20. The method of claim 19, wherein the step of predetermining comprises:
providing an electrostatic deflector; and
controlling a voltage to the deflector.

21. The method of claim 19, wherein the at least two amounts of deflection, relative to a center-to-center spacing between undeflected pixels, are respectively about ½ and zero.

22. The method of claim 18, wherein the raster pattern defines two perpendicular directions, and the step of deflecting includes deflecting along only one of the two directions.

23. The method of claim 18, further comprising:
modulating a duration of the exposure of at least some of the pixels at the edge of the feature, thereby defining the edge of the feature as a line lying off a grid defined by locations of the pixels of the raster pattern.

24. The method of claim 23, wherein the step of modulating comprises:
predetermining at least two durations of the exposure; and
selecting one of the at least two durations for each pixel to be exposed.

25. The method of claim 24, wherein the step of predetermining comprises:
providing a delay circuit having two pairs of delays, each having two delays, one delay associated with a beginning and one delay associated with a termination of a particular pixel exposure duration.

26. The method of claim 25, wherein the step of selecting comprises:
providing a timing signal and a duration selection signal to a blanker for blanking the beam; and
blanking the beam in accordance with the timing signal and the duration selection signal to modulate the duration of the exposure.

27. The method of claim 26, wherein the duration selection signal is a digital signal having at least two digits for each pixel of the plurality of pixels.

28. The method of claim 24, further comprising providing at least three predetermined durations of 100%, about 70%, and about 30% of a full pixel exposure duration; and further comprising the steps of:
exposing pixels at the about 70% duration for a particular pixel occurring at an edge of the feature located about ⅔ of the way between the particular pixel and an adjacent unexposed pixel; and
exposing pixels at the about 30% duration for a particular pixel occurring at an edge of the feature located about ⅓ of the way between the particular pixel and an adjacent unexposed pixel.

29. The method of claim 18, wherein the step of deflecting comprises deflecting the beam while it is scanning about three pixels in a line at the edge.

30. A raster scan photolithography apparatus adapted for defining an edge of an exposed feature at a location lying off a grid defined by the raster, comprising:
a beam generator;
a lens for deflecting the beam;
a support for a medium sensitive to exposure from the beam;
a raster scanning system for scanning the beam across the medium in a raster grid pattern having a plurality of pixels; and
a deflection controller for deflecting a location of at least some of the pixels to at least two predetermined locations intermediate of locations defined by the raster grid pattern.

31. The apparatus of claim 30, wherein the lens includes at least one beam deflector; and the lens controller includes means for variably adjusting the amount of deflection by the beam deflector.

32. A method of exposing a medium which is sensitive to exposure from a beam in a raster scan lithography apparatus, so as to achieve a feature edge location finer than a grid defined by the raster, comprising the steps of:
scanning the beam across a surface of the medium in a raster pattern, thereby exposing a plurality of pixels of the raster pattern on the medium to form at least one exposed feature on the surface of the medium, the feature including the plurality of the pixels and having at least one edge;
reducing a duration of the exposure of at least some of the pixels at the edge of the feature, thereby defining the edge of the feature as a line lying off a grid defined by locations of the pixels of the raster pattern; and
deflecting the beam while it is scanning at least some of the pixels at the edge of the feature, thereby locating the pixels at the edge at locations lying off the grid.

33. A method Of exposing a medium which is sensitive to exposure from a beam in a raster scan lithography apparatus, comprising the steps of:
scanning the beam across a surface of the medium in a raster pattern, thereby exposing a plurality of pixels of the raster pattern on the medium to form at least one exposed feature on the surface of the medium, the feature including the plurality of the pixels and having at least one edge; and
modulating a duration of the exposure of at least some of the pixels at the edge of the feature by varying a pulse width defining a duration of the pixels, thereby defining the edge of the feature as a line lying off a grid defined by locations of the pixels of the raster pattern.

* * * * *